United States Patent
E

(10) Patent No.: US 11,510,330 B2
(45) Date of Patent: Nov. 22, 2022

(54) DISPLAY MODULE AND DISPLAY DEVICE

(71) Applicant: Wuhan China Star Optoelectronics Semiconductor Display Technology Co., Ltd., Wuhan (CN)

(72) Inventor: Shuang E, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 484 days.

(21) Appl. No.: 16/632,550

(22) PCT Filed: Nov. 4, 2019

(86) PCT No.: PCT/CN2019/115429
§ 371 (c)(1),
(2) Date: Jan. 21, 2020

(87) PCT Pub. No.: WO2021/012457
PCT Pub. Date: Jan. 28, 2021

(65) Prior Publication Data
US 2021/0392767 A1 Dec. 16, 2021

(30) Foreign Application Priority Data
Jul. 24, 2019 (CN) .................. 201910671753.8

(51) Int. Cl.
*H05K 5/03* (2006.01)
*G03B 30/00* (2021.01)
*H04N 5/225* (2006.01)
*H05K 5/00* (2006.01)
*G02B 5/30* (2006.01)

(52) U.S. Cl.
CPC ............... *H05K 5/03* (2013.01); *G03B 30/00* (2021.01); *H04N 5/2257* (2013.01); *H05K 5/0017* (2013.01); *G02B 5/3025* (2013.01)

(58) Field of Classification Search
CPC .... G02B 5/3025; G02B 5/005; G02B 5/3033; G02B 2027/0178; G02B 27/0172; G02B 26/06; G03B 11/045; G03B 17/02; G03B 13/06; G03B 30/00; H05K 5/03; H04N 5/2257; H04N 5/2252; G06F 1/1686
See application file for complete search history.

(56) References Cited

U.S. PATENT DOCUMENTS 10,534,221 B1 * 1/2020 Zhu .................. G02F 1/133528
11,196,849 B2 * 12/2021 Tang .................... G06F 1/1686
(Continued)

FOREIGN PATENT DOCUMENTS

CN 107340942 11/2017
CN 107528008 12/2017
(Continued)

*Primary Examiner* — Adam B Dravininkas

(57) ABSTRACT

A display module and a display device are provided. The display module is used in the display device having a camera lens, and the display module includes a display panel and a cover plate. A camera hole is defined in a position of the display panel corresponding to the camera lens. The cover plate is disposed on the display panel. A recess is defined in a side surface of the display panel to form a receiving hole which is disposed correspondingly to the camera hole. A ring-shaped blocking layer is disposed in the receiving hole to block a periphery of the camera hole.

18 Claims, 2 Drawing Sheets

(56) References Cited

U.S. PATENT DOCUMENTS

| | | | | |
|---|---|---|---|---|
| 2010/0182538 | A1* | 7/2010 | Takata | G02B 5/208 349/64 |
| 2010/0309369 | A1* | 12/2010 | Jarvis | H04N 5/2257 348/371 |
| 2010/0315570 | A1* | 12/2010 | Mathew | H05K 5/0017 257/E27.111 |
| 2013/0265470 | A1* | 10/2013 | Liu | H04N 5/2253 348/294 |
| 2014/0161432 | A1* | 6/2014 | Park | G02B 5/005 396/85 |
| 2014/0219646 | A1* | 8/2014 | Hooton | G03B 15/03 396/176 |
| 2014/0267876 | A1* | 9/2014 | Chen | H04N 5/2257 348/335 |
| 2017/0111557 | A1* | 4/2017 | Ko | G02B 7/02 |
| 2017/0187934 | A1* | 6/2017 | Kwak | H04N 5/2251 |
| 2019/0182969 | A1 | 6/2019 | Chen | |
| 2019/0229295 | A1 | 7/2019 | Wang et al. | |

FOREIGN PATENT DOCUMENTS

| | | |
|---|---|---|
| CN | 107863002 | 3/2018 |
| CN | 207115380 | 3/2018 |
| CN | 108021257 | 5/2018 |
| CN | 207853957 | 9/2018 |
| CN | 108628043 | 10/2018 |
| CN | 108681131 | 10/2018 |
| CN | 108845455 | 11/2018 |
| CN | 108957855 | 12/2018 |
| CN | 108990336 | 12/2018 |
| CN | 109031756 | 12/2018 |
| CN | 109040380 | 12/2018 |
| CN | 109218475 | 1/2019 |
| CN | 109272868 | 1/2019 |
| CN | 109459880 | 3/2019 |
| CN | 208922027 | 5/2019 |
| CN | 109887408 | 6/2019 |
| KR | 2012-0118205 | 10/2012 |

* cited by examiner

DISPLAY MODULE AND DISPLAY DEVICE

RELATED APPLICATIONS

This application is a National Phase of PCT Patent Application No. PCT/CN2019/115429 having International filing date of Nov. 4, 2019, which claims the benefit of priority of Chinese Patent Application No. 201910671753.8 filed on Jul. 24, 2019. The contents of the above applications are all incorporated by reference as if fully set forth herein in their entirety.

FILED AND BACKGROUND OF THE INVENTION

The present disclosure relates to the field of display technology and, more particularly, relates to a display module and a display device.

With rapid development of portable terminals, it is becoming more and more common that a camera and a glass cover plate are disposed on a bottom side of the portable terminals, and a camera hole is defined in a position of the display panel corresponding to a camera lens, thereby increasing screen-to-body ratio of display devices, which brings users a better viewing experience.

A side of the glass cover plate facing the display panel is further provided with a blocking structure to block wires disposed on a periphery of the camera hole, thereby, to a certain degree, preventing light in the display panel from leaking from the camera hole.

Regarding the technical problem: protrusions are formed when the side of the glass cover plate facing the display panel is provided with the blocking structure. As a result, when a cover plate and the display panel are combined, air bubbles are easily generated between an optically clear adhesive (OCA) and the cover plate, which affect display effect of display modules.

SUMMARY OF THE INVENTION

The present disclosure provides a display module and a display device, which can, at least to a certain degree, prevent a situation that air bubbles are prone to be generated between an OCA and a cover plate, which affect display effect of display modules because of a too-thick ring-shaped blocking layer on the cover plate after a cover plate and a display panel are combined.

The present disclosure provides a display module used in a display device having a camera lens, including: a display panel, wherein a camera hole is defined in a position of the display panel corresponding to the camera lens; and a cover plate, wherein the cover plate is disposed on the display panel, a recess is defined in a side surface of the display panel facing the cover plate to form a receiving hole, the receiving hole is disposed correspondingly to the camera hole, and a ring-shaped blocking layer is disposed in the receiving hole to block a periphery of the camera hole.

A depth of the receiving hole is greater than or same as a thickness of the ring-shaped blocking layer, and a diameter of the receiving hole is greater than or same as a diameter of the camera hole.

In some embodiments, the ring-shaped blocking layer is disposed in a circular-ring shaped arrangement on a bottom periphery of the receiving hole.

In some embodiments, an outer diameter of the ring-shaped blocking layer is greater than or same as an internal diameter of the camera hole, and an internal diameter of the ring-shaped blocking layer is less than the internal diameter of the camera hole.

The present disclosure further provides a display module used in a display device having a camera lens, including: a display panel, wherein a camera hole is defined in a position of the display panel corresponding to the camera lens; and a cover plate, wherein the cover plate is disposed on the display panel, a recess is defined in a side surface of the display panel facing the cover plate to form a receiving hole, the receiving hole is disposed correspondingly to the camera hole, and a ring-shaped blocking layer is disposed in the receiving hole to block a periphery of the camera hole;

In some embodiments, a depth of the receiving hole is greater than or same as a thickness of the ring-shaped blocking layer, and In some embodiments, a diameter of the receiving hole is greater than or same as a diameter of the camera hole.

In some embodiments, the ring-shaped blocking layer is disposed in a circular-ring shaped arrangement on a bottom periphery of the receiving hole.

In some embodiments, an outer diameter of the ring-shaped blocking layer is greater than or same as an internal diameter of the camera hole, and an internal diameter of the ring-shaped blocking layer is less than the internal diameter of the camera hole.

In some embodiments, the receiving hole is a circular hole or a ring-shaped hole.

In some embodiments, the ring-shaped blocking layer is made of black ink.

In some embodiments, the display panel includes a display layer and a polarizer layer which are stacked, and the camera hole passes and extends through the display layer and the polarizer layer.

In some embodiments, an optically clear adhesive layer is disposed between the polarizer layer and the cover plate.

In some embodiments, the cover plate includes a transparent glass cover plate or a transparent flexible cover plate.

The present disclosure provides an OLED display panel, including: a camera lens; and the above display module, wherein the display module includes: a display panel, wherein a camera hole is defined in a position of the display panel corresponding to the camera lens; and a cover plate, wherein the cover plate is disposed on the display panel, a recess is defined in a side surface of the display panel facing the cover plate to form a receiving hole, the receiving hole is disposed correspondingly to the camera hole, and a ring-shaped blocking layer is disposed in the receiving hole to block a periphery of the camera hole.

The camera is disposed on a side of the display panel away from the cover plate and is disposed correspondingly to the camera hole defined in the display panel.

In some embodiments, a depth of the receiving hole is greater than or same as a thickness of the ring-shaped blocking layer, and In some embodiments, a diameter of the receiving hole is greater than or same as a diameter of the camera hole.

In some embodiments, the ring-shaped blocking layer is disposed in a circular-ring shaped arrangement on a bottom periphery of the receiving hole.

In some embodiments, an outer diameter of the ring-shaped blocking layer is greater than or same as an internal diameter of the camera hole, and an internal diameter of the ring-shaped blocking layer is less than the internal diameter of the camera hole.

In some embodiments, the receiving hole is a circular hole or a ring-shaped hole.

In some embodiments, the ring-shaped blocking layer is made of black ink.

In some embodiments, the display panel includes a display layer and a polarizer layer which are stacked, and the camera hole passes and extends through the display layer and the polarizer layer.

In some embodiments, an optically clear adhesive layer is disposed between the polarizer layer and the cover plate.

In some embodiments, the cover plate includes a transparent glass cover plate or a transparent flexible cover plate.

Regarding the beneficial effects: in a display module of the present disclosure, a recess is defined in a side of a display panel facing a cover plate to form a receiving hole which corresponds to a position of a camera hole disposed on the display panel, and a ring-shaped blocking layer configured to block a periphery of the camera hole is disposed in the receiving hole to reduce height of the ring-shaped cover plate which protrudes from a surface of the cover plate. Therefore, a situation that air bubbles are easily generated between an optically clear adhesive and a cover plate due to an overly thick ring-shaped blocking layer on the cover plate after the cover plate and the display panel are combined, which affects display effect of a display module, can be prevented.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DESCRIPTION OF SPECIFIC EMBODIMENTS OF THE INVENTION

Figure 1:
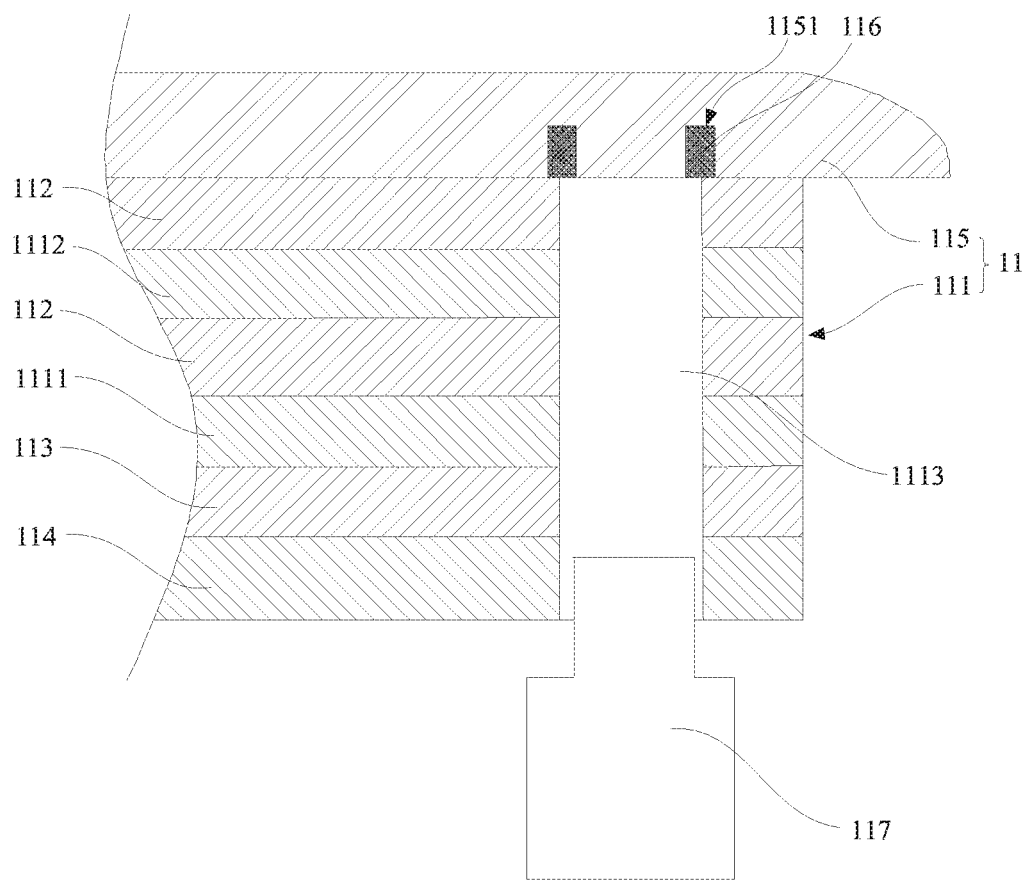
FIG. 1 is a sectional view showing a display module provided by an embodiment of the present disclosure.

Hereinafter, preferred embodiments of the present disclosure will be described with reference to the accompanying drawings to exemplify the embodiments of the present disclosure, which can fully describe the technical contents of the present disclosure to make the technical content of the present disclosure clearer and easier to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the present disclosure, the word "exemplary" is used herein to mean "serving as an example, instance, or illustration." Any embodiment described herein as "exemplary" is not necessarily to be construed as preferred or advantageous over other embodiments. Descriptions are provided to make any skilled in the art able to realize and utilize the present disclosure. In the following descriptions, details are listed for the purpose of illustration. It should be noted that those skilled in the art may realize the present disclosure without using the specific details. In other embodiments, conventional structures and processes are not illustrated in detail to prevent the illustration of the present disclosure from being complicated due to unnecessary details. Therefore, exemplary embodiments are consistent with principles and features, which are interpreted broadly, disclosed by the present disclosure but shall not be regarded as limitations of the present disclosure.

The present disclosure provides a display module which is described in detail below.

Referring to FIG. 1, a display module 11 is mainly used in a display device 10 having a camera lens 117. The display module 11 includes a display panel 111 and a cover plate 115 covering the display panel 111. A camera hole 1113 is defined in a position of the display panel 111 that corresponds to the camera lens 117 disposed in the display device 10. The camera hole 1113 extends through the display panel 111. Light outside the display device 10 passes through the cover plate 115 and the camera hole 1113 to enter the camera lens 117 so that the camera lens 117 may realize photography. The camera lens 117 may extend into the camera hole 1113 or may be positioned outside the camera hole 1113.

Figure 2:
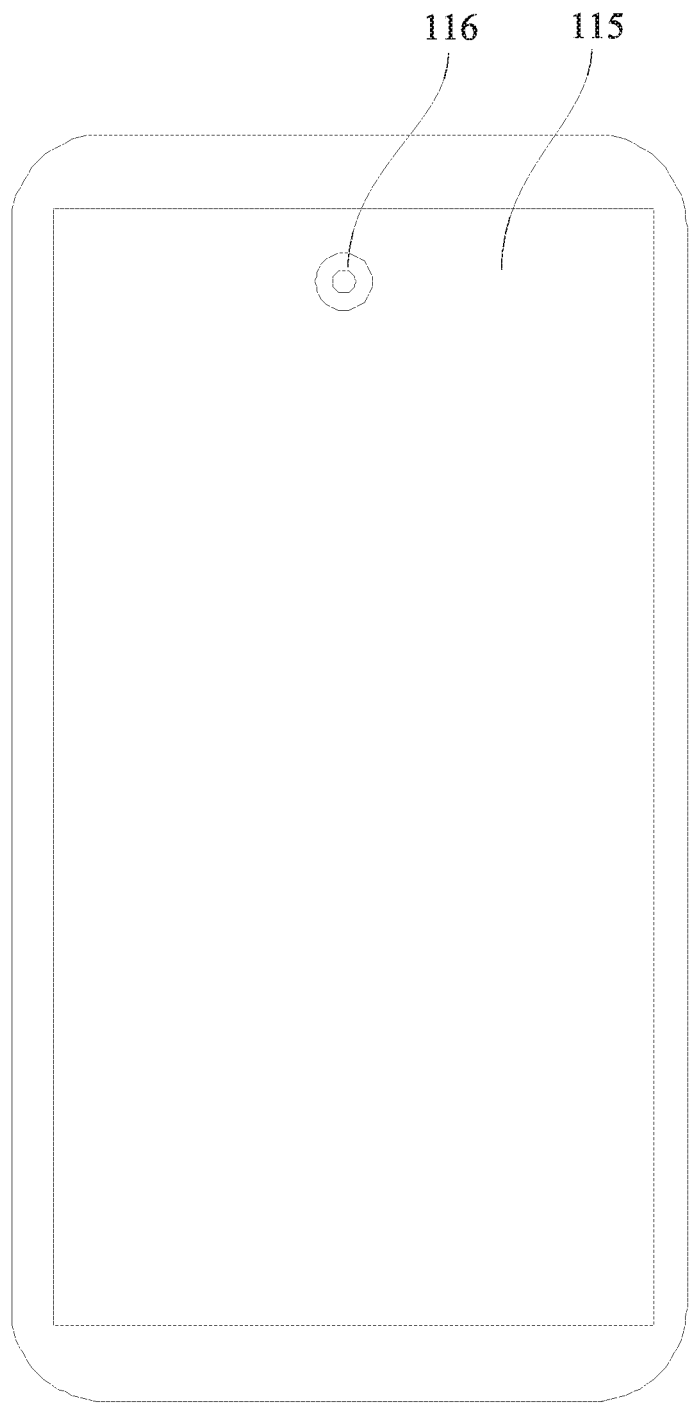
FIG. 2 is a schematic structural view showing a cover plate provided by an embodiment of the present disclosure.

Referring to FIG. 1 and FIG. 2, a ring-shaped blocking layer 116 is disposed on a side of the cover plate 115 facing the display panel 111. The ring-shaped blocking layer 116 is disposed correspondingly to the camera hole 1113 to block a periphery of the camera hole 1113, thereby blocking light and preventing light generated by a light source in the display panel 111 from leaking outside the display module 11 through the camera hole 1113. Meanwhile, the ring-shaped blocking layer 116 blocks the periphery of the camera hole 1113 so that structures, such as wires, surrounding the camera hole 1113 may also be blocked, resulting in a tidy appearance of the display module 11.

A recess may be defined in a side surface of the cover plate 115 facing the display panel 111 to form a receiving hole 1151 which is disposed correspondingly to the camera hole 1113, and the ring-shaped blocking layer 116 is disposed in the receiving hole 1151. Therefore, the ring-shaped blocking layer 116 may, to a certain degree, be prevented from protruding from a surface of the cover plate 115. As a result, when the cover plate 115 and the display panel 111 are combined, a situation that air bubbles are easily generated between the display panel 111 and the cover plate 115, which affects display effect of the display device 10, may be prevented.

It should be noted that the receiving hole 1151 and the cover plate 115 may be formed in a single process. Alternatively, the receiving hole 1151 may be formed by forming a recess on the cover plate 115 after the cover plate 115 is formed. The forming way of the cover plate 115 may be decided by a material of the cover plate 115.

In some embodiments, as shown in FIG. 1, the display panel 111 may include a display layer 1111 and a polarizer layer 1112 which are stacked. The camera hole 1113 extends and passes through the display layer 1111 and the polarizer layer 1112, thereby ensuring that light outside the display module 11 may enter the camera lens 117 after the light passes through the camera hole 1113.

The display layer 1111 is disposed on a side of the polarizer layer 1112 away from the cover plate 115 and is attached to a surface of the polarizer layer 1112 away from the cover plate 115 by an optically clear adhesive (OCA) layer 112. The display layer 1111 is configured to display images. The polarizer layer 1112 may convert natural light into polarized light, that is, only light oriented along a certain direction can pass through the polarizer layer 1112, whereas light oriented along other directions is absorbed, thereby improving display effect of the display panel 111.

The polarizer layer 1112 may be a polarizer structure having a touch control electrode. The display layer 1111 may be a glass having an organic light-emitting diode, or may be a glass having liquid crystals.

In some embodiments, the OCA layer 112 is further disposed between the polarizer layer 1112 and the cover plate 115. The polarizer layer 1112 is attached to the surface of the cover plate 115 facing the display panel 111 by the OCA layer 112.

The OCA layer 112 may be regarded as a special adhesive configured to bond transparent optical components. The OCA layer 112 has advantages such as transparency, over 90% light transmittance, and strong gel strength. Typically, the OCA layer 112 may be cured at room temperature or medium temperature, and a size of the OCA layer 112 is reduced after it is cured. Adhesives such as silicone, acrylic, unsaturated polyester, polyurethane, and epoxy can bond optical components. Typically, some treating agents need to be added during a process to improve optical performance and reduce curing shrinkage of the OCA layer 112. Of course, the OCA layer 112 may be a natural resin OCA or a synthetic resin OCA.

Furthermore, the display panel 111 may further include a backplate 113 disposed on a side of the display layer 1111 away from the polarizer layer 1112 and a heat dissipation layer 114 having a three-in-one structure of filling layer/ longitudinal thermal conductive material/substrate. The camera hole 1113 also extends and passes through the backplate 113 and the heat dissipation layer 114. Because the backplate 113 and the heat dissipation layer 114 are conventional structures, they will not be described here.

In some embodiments, a depth of the receiving hole 1151 may be greater than or same as a thickness of the ring-shaped blocking layer 116. Therefore, after the ring-shaped blocking layer 116 is disposed in the receiving hole 1151, the ring-shaped blocking layer 116 will not protrude from the surface of the cover plate 115 facing the display panel 111. That is, height differences will not occur between the ring-shaped blocking layer 116 and the surface of the cover plate 115, thereby further ensuring that air bubbles will not generate between the cover plate 115 and the display panel 111 due to the ring-shaped blocking layer 116.

It should be noted that the depth of the receiving hole 1151 denotes a depth of the receiving hole 1151 which is covered by the ring-shaped blocking layer 116. A depth of the receiving hole which is not covered by the ring-shaped blocking layer 116 may be greater than, same as, or less than the thickness of the ring-shaped blocking layer 116 which is covered by the ring-shaped blocking layer 116, and is not limited here. Of course, when a bottom surface of receiving hole 1151 is flat, the depth of the receiving hole 1151 which is covered by the ring-shaped blocking layer 116 is same as the depth of the receiving hole 1151 which is not covered by the ring-shaped blocking layer 116.

In some embodiments, the depth of the receiving hole 1151 may be same as the thickness of the ring-shaped blocking layer 116 so that a surface of the ring-shaped blocking layer 116 facing the display panel 111 and the surface of the cover plate 115 facing the display panel 111 form a flat plane. When the display panel 111 and the cover plate 115 are attached to each other by the OCA layer 112, the OCA layer 112 may be attached to a portion of the surface of the ring-shaped blocking layer 116, thereby stably confining the ring-shaped blocking layer 116 in the receiving hole 1151.

Of course, the depth of the receiving hole 1151 may be less than the thickness of the blocking layer 116. Meanwhile, a height of a protrusion of the ring-shaped blocking layer 116 from the surface of the cover plate 115 facing the display panel 111 may be reduced, thereby reducing a possibility, to a certain degree, that air bubbles are generated because of the ring-shaped blocking layer 116 after the cover plate 115 and the display panel 111 are attached to each other.

A specific depth of the receiving hole 1151 may be decided by a thickness of a ring-shaped cover portion. For example, when black ink is printed on a bottom of the receiving hole 1151 to form the ring-shaped blocking layer 116, to achieve a better blocking effect of the ring-shaped blocking layer 116, the thickness of the ring-shaped blocking layer 116 is typically greater than or equal to 12 μm and less than or equal to 40 μm. Meanwhile, the depth of the receiving hole 1151 may be greater than or equal to 12 μm and less than or equal to 40 μm, so that the ring-shaped blocking layer 116 will not protrude from the surface of the cover plate 115 facing the display panel 111. At the same time, structural strength of the cover plate 115 is prevented from being affected by an overly deep receiving hole 1151 defined on the cover plate 115.

In addition, a shape of the receiving hole 1151 may be a circle, a ring, or other shapes that can contain the ring-shaped blocking layer 116.

In some embodiments, a diameter of the receiving hole 1151 may be greater than or same as a diameter of the camera hole 1113 so that the ring-shaped blocking layer 116 disposed in the receiving hole 1151 may block as much periphery areas of the camera hole 1113 as possible.

Specifically, the ring-shaped blocking layer 116 may be disposed on a bottom periphery of the receiving hole 1151, thereby maximizing an outer diameter of the ring-shaped blocking layer 116 and improving blocking effect of the ring-shaped blocking layer 116. The blocking layer 116 may be arranged in a ring shape to match shapes of the ring-shaped blocking layer 116 and the camera hole 1113.

In some embodiments, the outer diameter of the ring-shaped blocking layer 116 may be greater than or same as an inner diameter of the camera hole 1113. At the same time, an inner diameter of the ring-shaped blocking layer 116 may be less than the inner diameter of the camera hole 1113, thereby making the ring-shaped blocking layer 116 able to completely block the periphery of the camera hole 1113, further improving light-blocking effect of the ring-shaped blocking layer 116, and resulting in a tidy appearance of the display module 11.

In some embodiments, the ring-shaped layer 116 may be made of black ink so that the ring-shaped blocking layer 116 and the cover plate 115 may be conveniently and stably connected. Therefore, the ring-shaped blocking layer 116 may have a better blocking effect. Specifically, the black ink may be printed on the bottom surface of the receiving hole 1151 to form the ring-shaped blocking layer 116 so that a thickness of the black ink may be thinner, and. the black ink and the bottom surface of the receiving hole 1151 are stably connected.

Of course, the ring-shaped blocking layer 116 may be made of other materials, for example, a nontransparent ring-shaped adhesive is attached to the bottom surface of the receiving hole 1151 to form the ring-shaped blocking layer 116. Meanwhile, the ring-shaped blocking layer 116 may be connected to the bottom surface of the receiving hole 1151 or a lateral wall of the receiving hole 1151. Alternatively, the ring-shaped blocking layer 116 is simultaneously connected to the bottom surface and the lateral wall of the receiving hole. Specifically, a connection way of the ring-shaped blocking layer 116 may be decided by its structure.

In one embodiment, the cover plate 115 is made of a transparent material.

Specifically, the cover plate 115 may be a transparent glass plate 115 or a cover plate made of other materials, for example, a cover plate 115 made of synthetic materials.

In addition, the cover plate 115 may also be a flexible transparent cover plate which includes an outer frame made of polymer materials such as polyurethane or polystyrene, and shape-memory materials are filled in the outer frame. The cover plate 115 is formed by compressing the shape-memory materials with the outer frame into a single structure. The shape-memory materials include two phases that are incompletely compatible, namely, a stationary phase configured to maintain a shape of a product and a reversible phase of softening and hardening according to temperature changes. The stationary phase is configured to remember and recover an original shape of the product, while the reversible phase is configured to ensure that the shape of the product can be changed.

The present disclosure further provides a display device 10 including a camera lens 117 and the above display module 11. The camera lens 117 is disposed on a side of the display panel 111 away from the back plate 115 and is disposed correspondingly to the camera hole 1113. Specifically, structures of the display module 11 may be understood with reference to the above embodiments. Because the display device 10 applies all of the technical solutions of the above embodiments, the display device 10 has all of the beneficial effects mentioned in the above embodiments which will not be described again here.

The display device 10 may be a mobile phone, a tablet, or any electronic device having a camera lens, and the present disclosure is not limited thereto.

In the above embodiments, the focus of each embodiment is different, and for a part that is not detailed in an embodiment, reference may be made to related descriptions of other embodiments.

In specific implementations, each of the above units or structures may be implemented independently or may be combined as one, several entities, or any combination to realize the present disclosure. Implementations of each of the above units or structures may be understood with reference to the above embodiments and will not be described again here.

A display panel and a display device have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display module used in a display device having a camera lens, comprising:
    a display panel, wherein a camera hole is defined in a position of the display panel corresponding to the camera lens; and
    a cover plate, wherein the cover plate is disposed on the display panel, a recess is defined in a surface of the cover plate facing the display panel to form a receiving hole, the receiving hole is disposed correspondingly to the camera hole, and a ring-shaped blocking layer is disposed in the receiving hole to block a periphery of the camera hole;
    wherein a depth of a portion of the receiving hole covered by the ring-shaped blocking layer is greater than a thickness of the ring-shaped blocking layer, and a depth of another portion of the receiving hole not covered by the ring-shaped blocking layer is less than a thickness of the ring-shaped blocking layer, and
    wherein a diameter of the receiving hole is greater than or equal to a diameter of the camera hole.

2. The display module of claim 1, wherein the ring-shaped blocking layer is disposed in a circular-ring shaped arrangement on a bottom periphery of the receiving hole.

3. The display module of claim 2, wherein an outer diameter of the ring-shaped blocking layer is greater than or equal to an internal diameter of the camera hole, and an internal diameter of the ring-shaped blocking layer is less than the internal diameter of the camera hole.

4. A display module used in a display device having a camera lens, comprising:
    a display panel, wherein a camera hole is defined in a position of the display panel corresponding to the camera lens; and
    a cover plate, wherein the cover plate is disposed on the display panel, a recess is defined in a surface of the cover plate facing the display panel to form a receiving hole, the receiving hole is disposed correspondingly to the camera hole, and a ring-shaped blocking layer is disposed in the receiving hole to block a periphery of the camera hole;
    wherein a depth of a portion of the receiving hole covered by the ring-shaped blocking layer is greater than a thickness of the ring-shaped blocking layer, and a depth of another portion of the receiving hole not covered by the ring-shaped blocking layer is less than a thickness of the ring-shaped blocking layer.

5. The display module of claim 4, wherein a diameter of the receiving hole is greater than or equal to a diameter of the camera hole.

6. The display module of claim 5, wherein the ring-shaped blocking layer is disposed in a circular-ring shaped arrangement on a bottom periphery of the receiving hole.

7. The display module of claim 6, wherein an outer diameter of the ring-shaped blocking layer is greater than or equal to an internal diameter of the camera hole, and an internal diameter of the ring-shaped blocking layer is less than the internal diameter of the camera hole.

8. The display module of claim 4, wherein the receiving hole is a circular hole or a ring-shaped hole.

9. The display module of claim 4, wherein the ring-shaped blocking layer is made of black ink.

10. The display module of claim 4, wherein the display panel comprises a display layer and a polarizer layer which are stacked, and the camera hole passes and extends through the display layer and the polarizer layer.

11. The display module of claim 10, wherein an optically clear adhesive layer is disposed between the polarizer layer and the cover plate.

12. The display module of claim 4, wherein the cover plate comprises a transparent cover plate or a transparent flexible cover plate.

13. A display device, comprising:
   a camera lens; and
   a display module, wherein the display module comprises:
   a display panel, wherein a camera hole is defined in a position of the display panel corresponding to the camera lens; and
   a cover plate, wherein the cover plate is disposed on the display panel, a recess is defined in a surface of the cover plate facing the display panel to form a receiving hole, the receiving hole is disposed correspondingly to the camera hole, and a ring-shaped blocking layer is disposed in the receiving hole to block a periphery of the camera hole; wherein a depth of a portion of the receiving hole covered by the ring-shaped blocking layer is greater than a thickness of the ring-shaped blocking layer, and a depth of another portion of the receiving hole not covered by the ring-shaped blocking layer is less than a thickness of the ring-shaped blocking layer; and
   wherein the camera lens is disposed on a side of the display panel away from the cover plate and is disposed correspondingly to the camera hole defined in the display panel.

14. The display module device of claim 13, wherein a diameter of the receiving hole is greater than or equal to a diameter of the camera hole.

15. The display module device of claim 14, wherein the ring-shaped blocking layer is disposed in a circular-ring shaped arrangement on a bottom periphery of the receiving hole.

16. The display module device of claim 15, wherein an outer diameter of the ring-shaped blocking layer is greater than or equal to an internal diameter of the camera hole, and an internal diameter of the ring-shaped blocking layer is less than the internal diameter of the camera hole.

17. The display module device of claim 13, wherein the ring-shaped blocking layer is made of black ink.

18. The display module device of claim 13, wherein the display panel comprises a display layer and a polarizer layer which are stacked, and the camera hole passes and extends through the display layer and the polarizer layer.

* * * * *